(12) United States Patent
Xie et al.

(10) Patent No.: US 11,915,966 B2
(45) Date of Patent: Feb. 27, 2024

(54) BACKSIDE POWER RAIL INTEGRATION

(71) Applicant: International Business Machines Corporation, Armonk, NY (US)

(72) Inventors: Ruilong Xie, Niskayuna, NY (US); Takeshi Nogami, Schenectady, NY (US); Roy R. Yu, Poughkeepsie, NY (US); Balasubramanian Pranatharthiharan, Watervliet, NY (US); Albert M. Young, Fishkill, NY (US); Kisik Choi, Watervliet, NY (US); Brent Anderson, Jericho, VT (US)

(73) Assignee: International Business Machines Corporation, Armonk, NY (US)

(*) Notice: Subject to any disclaimer, the term of this patent is extended or adjusted under 35 U.S.C. 154(b) by 111 days.

(21) Appl. No.: 17/342,650

(22) Filed: Jun. 9, 2021

(65) Prior Publication Data
US 2022/0399224 A1    Dec. 15, 2022

(51) Int. Cl.
| H01L 21/74 | (2006.01) |
| H01L 21/768 | (2006.01) |
| H01L 23/528 | (2006.01) |
| H01L 23/535 | (2006.01) |
| H01L 27/088 | (2006.01) |

(52) U.S. Cl.
CPC ...... *H01L 21/743* (2013.01); *H01L 21/76805* (2013.01); *H01L 23/5286* (2013.01); *H01L 23/535* (2013.01); *H01L 27/0886* (2013.01)

(58) Field of Classification Search
CPC ............. H01L 21/743; H01L 21/76805; H01L 23/5286; H01L 23/535; H01L 27/0886; H01L 21/823431; H01L 21/76895; H01L 21/76898
See application file for complete search history.

(56) References Cited

U.S. PATENT DOCUMENTS

| 9,570,395 | B1 | 2/2017 | Sengupta et al. |
| 10,586,765 | B2 | 3/2020 | Smith et al. |
| 10,636,739 | B2 | 4/2020 | Beyne et al. |
| 10,700,207 | B2 | 6/2020 | Chen et al. |
| 10,886,224 | B2 | 1/2021 | Gerousis et al. |
| 2016/0343708 | A1 | 11/2016 | Park et al. |
| 2020/0105671 | A1 | 4/2020 | Lai et al. |
| 2020/0135634 | A1* | 4/2020 | Chiang ............... H01L 29/4175 |
| 2020/0203276 | A1 | 6/2020 | Hiblot et al. |
| 2020/0266169 | A1 | 8/2020 | Kang et al. |

(Continued)

*Primary Examiner* — Shahed Ahmed
*Assistant Examiner* — Vicki B. Booker
(74) *Attorney, Agent, or Firm* — Jeffrey M. Ingalls

(57) ABSTRACT

A method of manufacturing a semiconductor device is provided. The method includes forming a first trench partially through a first substrate from a first side of the first substrate. The method also includes widening a bottom portion of the first trench to form a lateral footing area of the first trench. The method includes forming a first metallization in the first trench; forming a second trench through a second substrate from a second side of the second substrate to expose at least a portion of first metallization in an area corresponding to the lateral footing area of the first trench, the second side being opposite to the first side. The method also includes forming a second metallization in the second trench in contact with the first metallization.

7 Claims, 16 Drawing Sheets

(56) References Cited

U.S. PATENT DOCUMENTS

2020/0279811 A1 9/2020 Hong et al.
2020/0365509 A1 11/2020 Sasaki et al.
2021/0035860 A1 2/2021 Eugenio et al.

* cited by examiner

BACKSIDE POWER RAIL INTEGRATION

BACKGROUND

The present disclosure relates to fabrication methods and resulting structures for semiconductor devices. More specifically, the present disclosure relates to fabrication methods and resulting structures for enabling backside power distribution network (BSPDN) integration with an improved nano through-silicon-vias (nTSV) to buried power rail (BPR) landing. The present disclosure also relates to fabrication methods and resulting structures for enabling BSPDN integration with an improved nTSV to cross-level via landing.

In certain semiconductor device fabrication processes, vias (e.g., nTSV) are formed through a silicon substrate to enable an electrical connection with a backside power distribution network (e.g., BPR). As critical dimensions of device features, such as a BPR, continue to decrease, misalignment of the electrical contact with these device features may be more common, especially given the relatively large thickness of the substrate (i.e., and therefore the height of the nTSVs and corresponding metal contacts formed therein). It may be desirable to reduce the occurrence or likelihood of these misalignments.

SUMMARY

Embodiments of the present disclosure relate to a semiconductor device. The semiconductor device includes a first substrate, a first metallization formed in the first substrate, a bottom portion of the first metallization having portions extending laterally therefrom, a second substrate, and a second metallization formed in the second substrate in contact with the first metallization.

Embodiments of the present disclosure relate to a method of manufacturing a semiconductor device. The method includes forming a first trench partially through a first substrate from a first side of the first substrate. The method also includes widening a bottom portion of the first trench to form a lateral footing area of the first trench. The method includes forming a first metallization in the first trench and forming a second trench through a second substrate from a second side of the second substrate to expose at least a portion of first metallization in an area corresponding to the lateral footing area of the first trench, the second side being opposite to the first side. The method also includes forming a second metallization in the second trench in contact with the first metallization.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
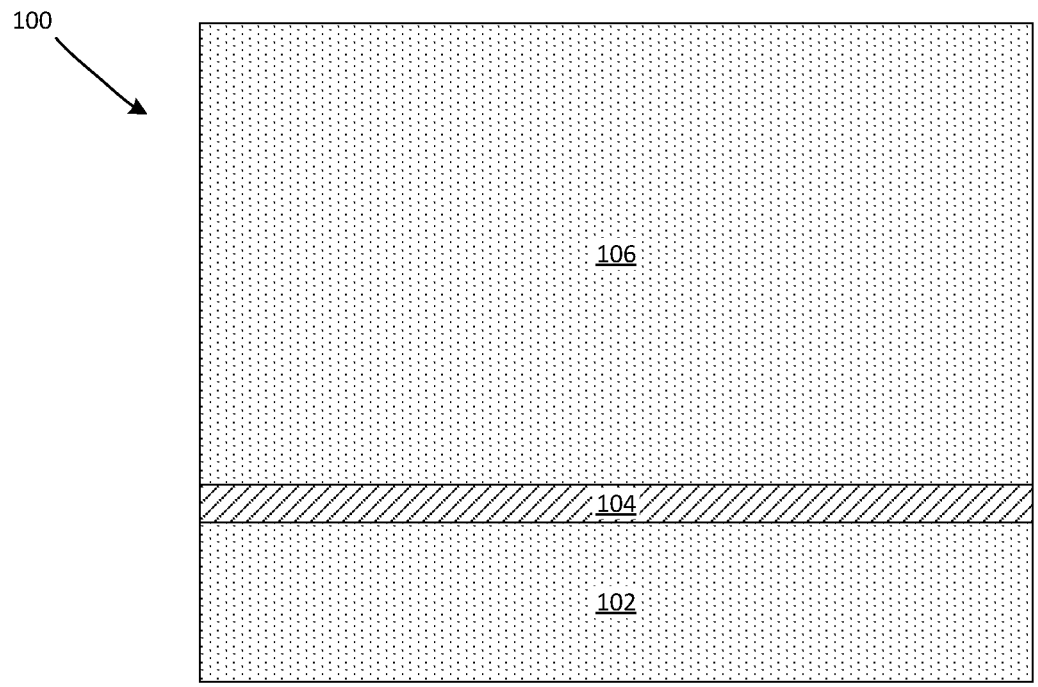
FIG. 1 is a cross-sectional view of a semiconductor device at an intermediate stage of the manufacturing process, according to embodiments.

The present disclosure describes semiconductor devices and methods of manufacturing the semiconductor devices. In particular, the present disclosure describes fabrication methods and resulting structures for enabling improved nTSV to BPR landing.

In certain semiconductor devices, buried power rails may be utilized. In general, buried power rails (BPRs) are power rails that are formed below a back-end-of-line (BEOL) metal stack, often times in-level with the transistor fins or even below the transistor fins. Back side (or below the transistor substrate) power delivery systems may help enable technology scaling beyond the 5 nm technology node. The BPR technology also may free up resources for dense logic connections that limit modern processor performance, thus enable further scaling of a standard logic cell. It may be necessary to create electrical connections with these BPRs through a relatively thick substrate. nano through-silicon vias (nTSV) may be formed through the substrate to expose the BPRs for electrical connection. However, because of the reduction in scale and size of the BPRs (e.g., 18 nm or less), the landing (or the area where the electrical connection is to be made) of the BPR is also reduced in size. Also, the thickness (or height) of the silicon substrate can be, for example, 400 nm or larger. Thus, the nTSV is relatively large compared with the landing size of the BPR As such, landing a tall nTSV over the small BPR may be challenging. Any misalignments in the contact to the BPR may result in higher resistance, open connection, or other reliability issues.

The flowcharts and cross-sectional diagrams in the Figures illustrate methods of manufacturing fin field-effect transistor (FINFET) devices according to various embodiments. In some alternative implementations, the manufacturing steps may occur in a different order that that which is noted in the Figures, and certain additional manufacturing steps may be implemented between the steps noted in the Figures. Moreover, any of the layered structures depicted in the Figures may contain multiple sublayers. Please note that in this disclosure we use FINFET as an illustrated example, however the disclosed method and structure applies to any kind of device type, such as a planar transistor, a nanosheet, a nanowire, stacked FETs, III-V or 2D channel FETs, etc.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Referring now to the drawings in which like numerals represent the same or similar elements and initially to FIG. 1, this figure depicts a cross-sectional view of a semiconductor device 100, according to embodiments. As shown in FIG. 1, a substrate 102 is provided. The substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate. The substrate 102 may be comprised of any other suitable material(s) that those listed above. As will be described in further detail below, the substrate 102 may ultimately subjected to a thinning process, where the substrate 102 is gradually removed by one or more of a grinding process and a chemical etching process. As shown in FIG. 1, a SiGe layer 104 is formed by epitaxy growth on the upper surface of the substrate 102. A second epitaxy layer 106 (e.g., additional Si material) is formed on the SiGe layer 104. The thickness of the layer 104 may range from about 5 to 40 nm, and the thickness of the second epitaxy layer 106 may range from about 10 to 300 nm.

Figure 2:
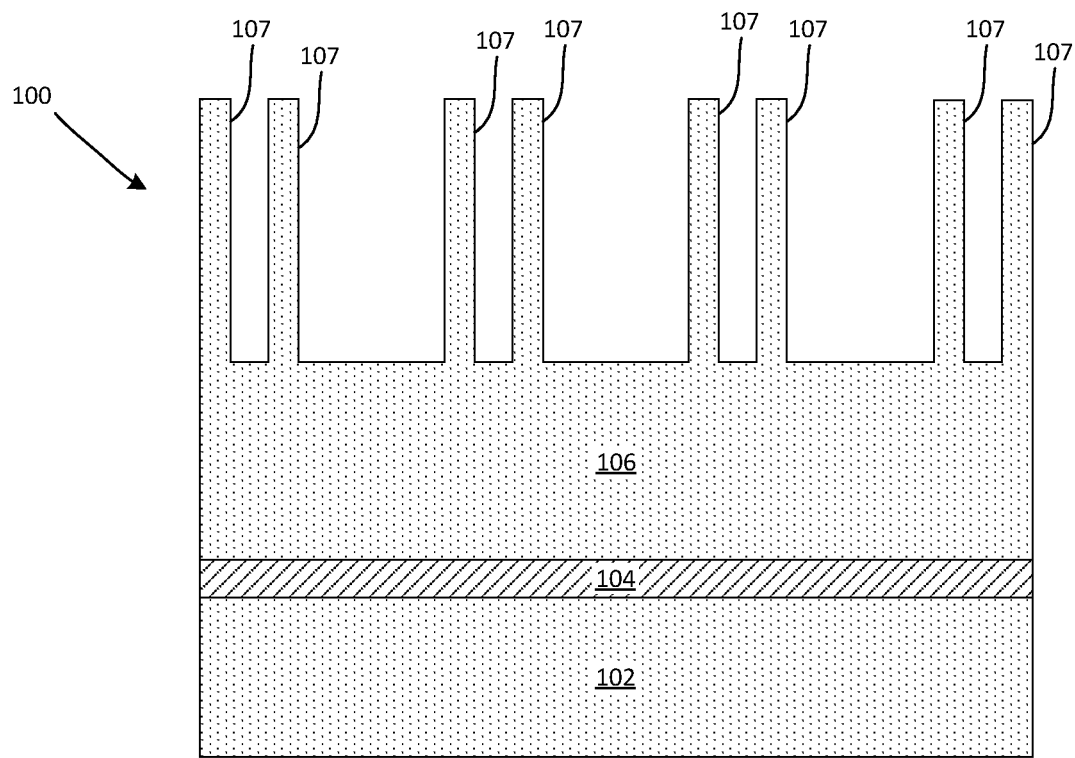
FIG. 2 is a cross-sectional view of the semiconductor device of FIG. 1 after additional fabrication operations, according to embodiments.

Referring now to FIG. 2, this figure depicts a cross-sectional view of the semiconductor device 100 of FIG. 1 after additional fabrication operations, according to embodiments. As shown in FIG. 2, transistor fins 107 may be formed by etching into the second epitaxial layer 106. This patterning may be performed with any suitable etching technique such as reactive ion etching (RIE) or plasma etching.

Figure 3:
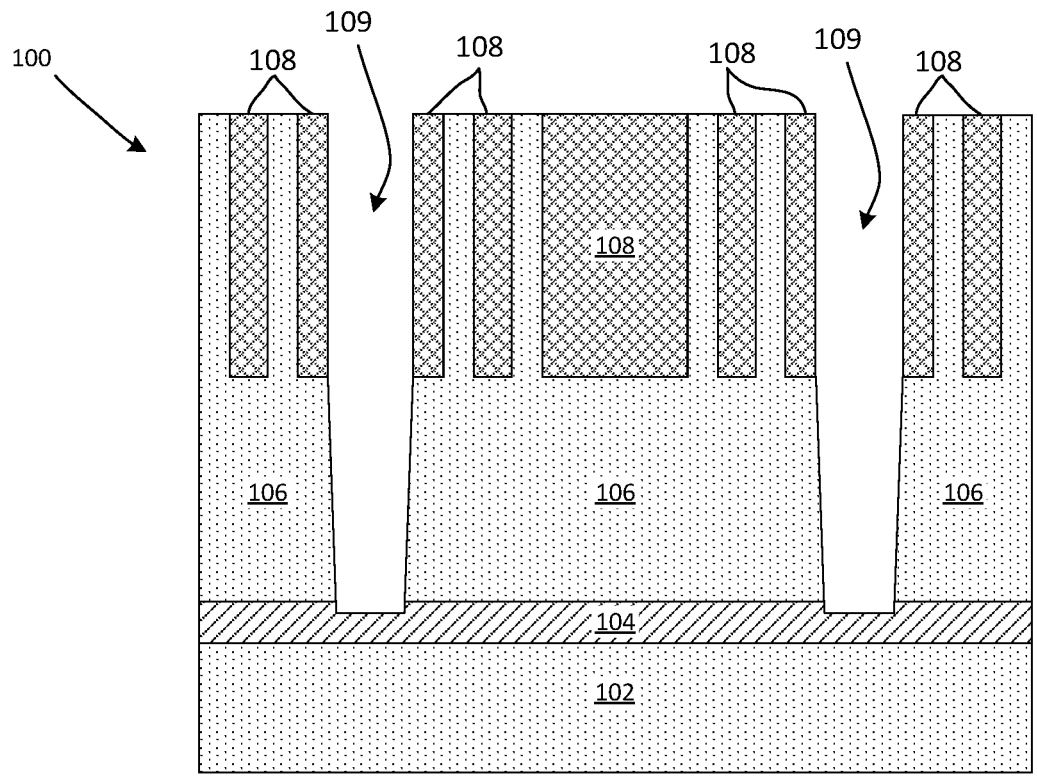
FIG. 3 is a cross-sectional view of the semiconductor device FIG. 2 after additional fabrication operations, according to embodiments.

Referring now to FIG. 3, this figure depicts a cross-sectional view of the semiconductor device 100 of FIG. 2 after additional fabrication operations, according to embodiments. As shown in FIG. 3, after the formation of the transistor fins 107, they are filled in with a sacrificial material (e.g., $TiO_x$) to form a sacrificial layer 108. In certain examples, the sacrificial layer 108 may be formed in excess above the upper surface of the second epitaxial layer 106. Then, the semiconductor device 100 may be planarized with a suitable material removal process such as CMP. As also shown in FIG. 3, a patterning process including lithography and etching processes is performed to remove material between the transistor fins 107. In particular, the etching in performed through the second epitaxial layer 106 and through at least a portion of the SiGe layer 104 to form first trenches 109. In certain examples, the SiGe layer 104 may be SiGe30, although other compositions may be used.

Figure 4:
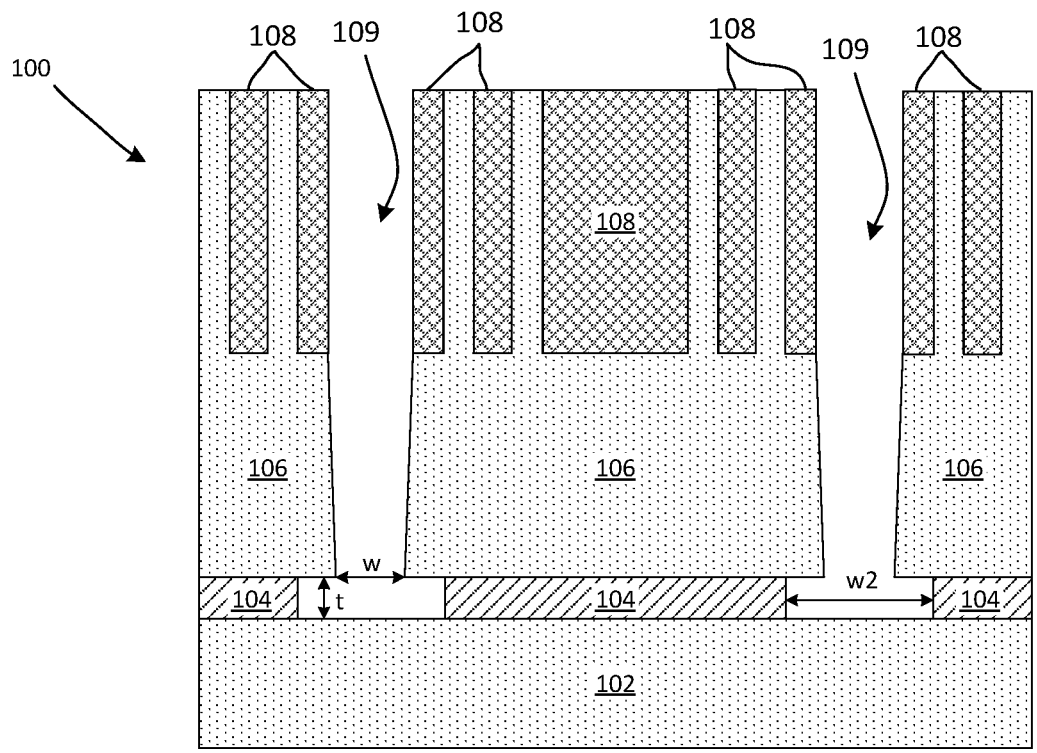
FIG. 4 is a cross-sectional view of the semiconductor device of FIG. 3 after additional fabrication operations, according to embodiments.

Referring now to FIG. 4, this figure depicts a cross-sectional view of the semiconductor device 100 of FIG. 3 after additional fabrication operations, according to embodiments. As shown in FIG. 4, after the formation of the first trenches 109, a lateral etching technique is performed on the SiGe layer 104. In certain examples, the w dimension is greater than the t dimension to ensure that a good BPR metal fill can be achieved. Thus, this additional lateral etching step alters the shape of the first trenches 109 so that the bottom portions of the trenches in the vicinity of the SiGe layer 104 has a wider w2 dimension than the w dimension described above. In other words, the method includes widening a bottom portion of the first trenches 109 to form a lateral footing area thereof. This area of the first trenches 109 is where the BPR metal layer will eventually be formed, as described in detail below. As described above, due to the small size of the BPR landing, misalignments could occur. However, according to the present embodiments, the wider w2 dimension of the bottom of the first trenches 109 allow increased flexibility with regard to the wider landing area of the BPR. Thus, in the present embodiments, misalignments and any resulting performance degradation associated therewith may be minimized.

Figure 5:
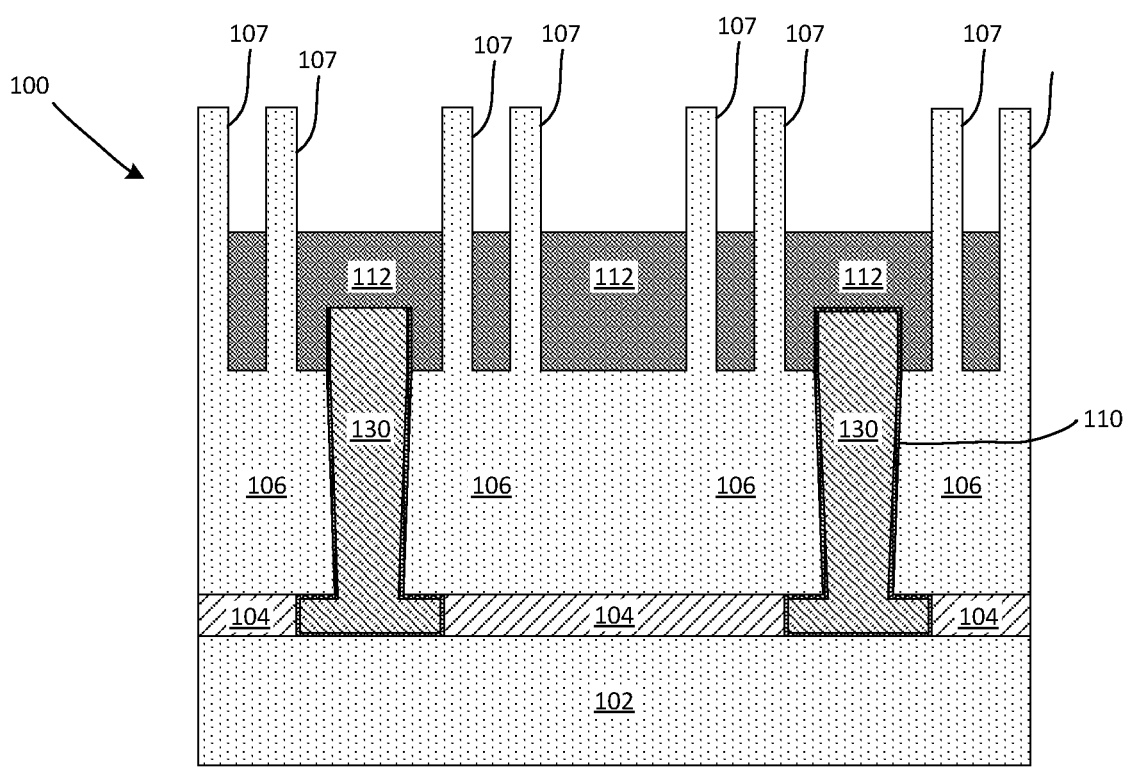
FIG. 5 is a cross-sectional view of the semiconductor device of FIG. 4 after additional fabrication operations, according to embodiments.

Referring now to FIG. 5, this figure depicts a cross-sectional view of the semiconductor device 100 of FIG. 4 after additional fabrication operations, according to embodiments. As shown in FIG. 5, a thin dielectric liner layer 110 may be formed on the walls of the first trench 109. Then, a buried power rail (BPR) 130 (or first metallization) is formed to fill the remainder of the first trench 109, followed by a metal recess. Then, additional fabrication operations are performed to define front-end-of-line (FEOL) active regions and shallow trench isolation (STI) regions (STI layer 112). In general, a standard cell (i.e., a base unit for designing and manufacturing an integrated circuit) of a device requires a power input and a ground connection. To power the various components thereof, each standard cell is generally coupled to a power rail which is electrically connected to an active layer of the standard cell to provide the power. In some instances, a plurality of power rails may be provided for each standard cell to respectively provide the power and the ground. Regarding a "buried" power rail (or buried rail), the rail can be encased either within the STI layer 112 or within the bulk silicon substrate 102 (and/or the second substrate 106) and the STI layer 112 together. In general, a BPR refers to a power rail that is buried below a back-end-of-line (BEOL) metal stack, usually in-level (or near in level) with the transistor fins themselves. A "back-side" generally refers to a level that is below a transistor substrate. The back-side power delivery may help alleviate certain design challenges and enable technology scaling beyond the 5 nm technology node. Also, BPR technology may free up resources for dense logic connections that limit modern processor performance, enable further scaling of a standard logic cell by removing the overhead in the area occupied by the power rails.

Referring again to FIG. 5, It should be appreciated that a combination of material removal processes (e.g., etching) and material addition processes (e.g., patterning and deposition) that are known one of skill in the art (and as described herein) may be used to generate the structures shown in FIG. 5. STI regions may be formed in various locations throughout the STI layer 112. In general, STI (also known as a shallow trench isolation technique) is an integrated circuit feature which prevents electric current leakage between adjacent semiconductor device components. STI is generally used on CMOS process technology nodes of 250 nanometers and smaller. It should be appreciated that the positions and locations of the various components (e.g., STI layer 112, transistor fins 107) may be varied in any suitable manner according to the specific application.

Figure 6:
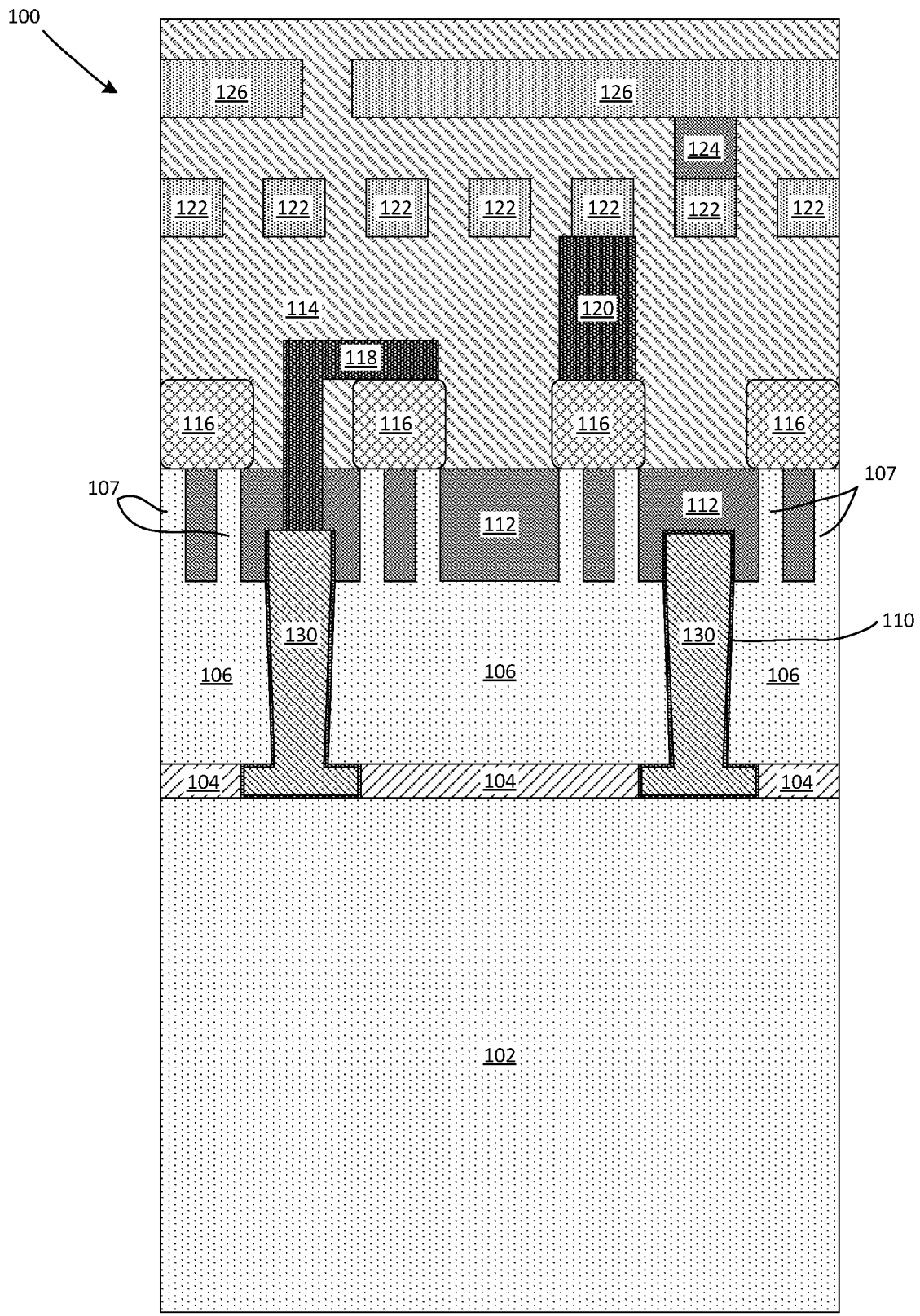
FIG. 6 is a cross-sectional view of the semiconductor device of FIG. 5 after additional fabrication operations, according to embodiments.

Referring now to FIG. 6, this figure depicts a cross-sectional view of the semiconductor device 100 of FIG. 5 after additional fabrication operations, according to embodiments. As shown in FIG. 5, several additional components are formed, which may include front-end-of-line (FEOL) components, middle-of-line (MOL) components, and back-end-of-line (BEOL) components. In the example shown in FIG. 6, source/drain epitaxial regions 116 are formed on top of the transistor fins 107. Several contacts 118 electrically connect the BPR layer 130 to the source/drain epitaxial regions 116. One or more dielectric layer 114, second contact 120, metal lines 122, first vias 124, and second metal lines 126 may be formed as part of FEOL, MOL and BEOL layers. It should be appreciated that the configuration of the FEOL, MOL and BEOL layers (not shown) and components thereof are merely one example that is used for the sake of providing context to the locations of the BPR layer 130 relative to the other components, and any suitable number/position/configuration of the layers may be used. In other words, the different metal layers, contacts, vias etc., are merely provided to show a nonlimiting example of where the BPR layer 130, and the SiGe layer 104 may be positioned relative to same.

Figure 7:
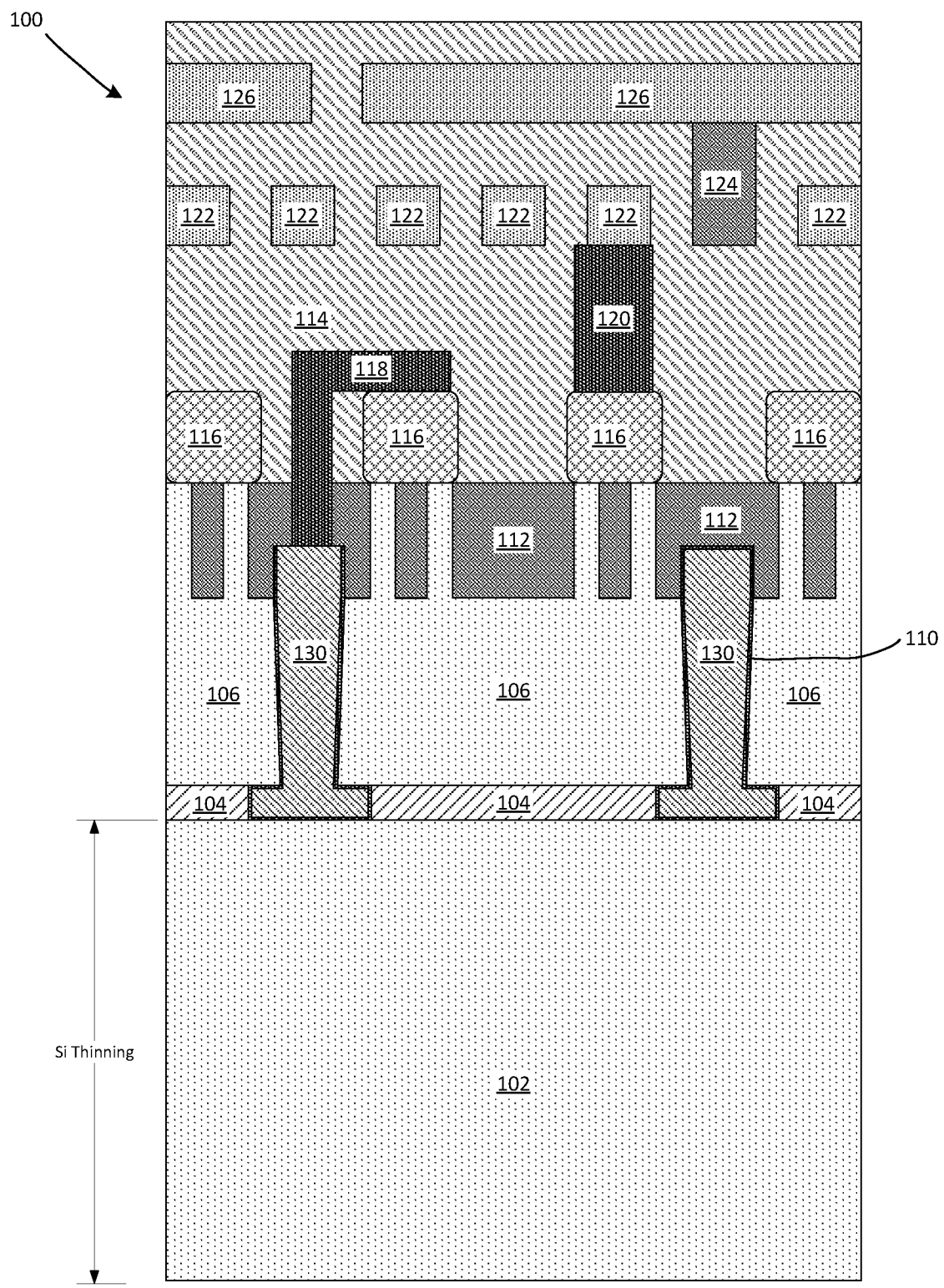
FIG. 7 is a cross-sectional view of the semiconductor device of FIG. 6 after additional fabrication operations, according to embodiments.

Referring now to FIG. 7, this figure depicts a cross-sectional view of the semiconductor device 100 of FIG. 6 after additional fabrication operations, according to embodiments. After BEOL processing, a carrier wafer (not shown) is bonded to the BEOL layers (not shown), after that, the semiconductor device 100 may be flipped upside down to prepare the device for substrate thinning (although it is not shown to be flipped in FIG. 7). As shown in FIG. 7, substrate thinning is performed to remove a certain amount of the substrate 102. This material removal step is continued until the substrate 102 is thinned down to a thickness of about 100 nm to 500 nm, for example. Other final thicknesses of the substrate may be suitable as well. Note that alternative approaches can be used other than substrate thinning to achieve a desired Si thickness of the substrate 102.

Figure 8:
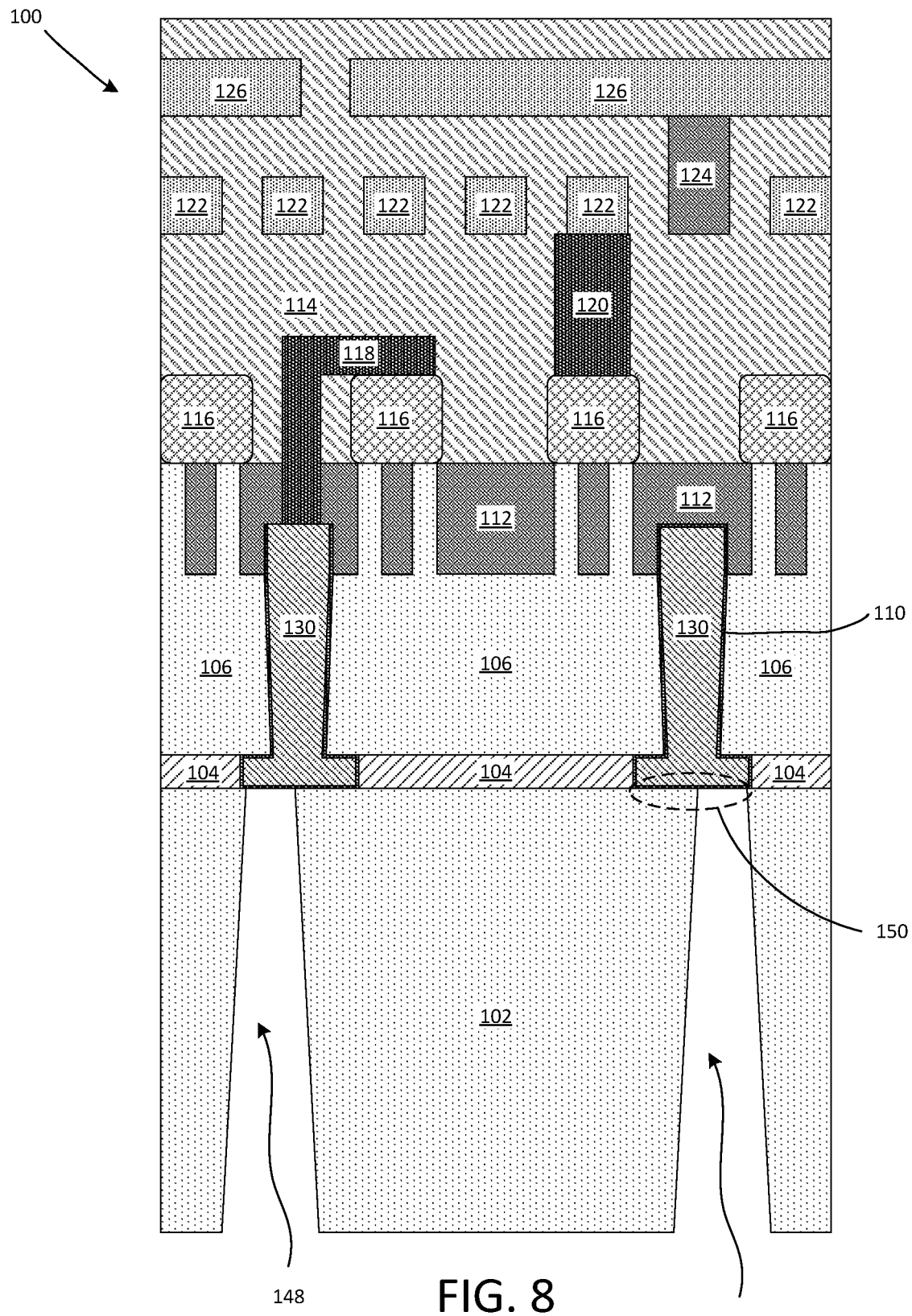
FIG. 8 is a cross-sectional view of the semiconductor device of FIG. 7 after additional fabrication operations, according to embodiments.

Referring now to FIG. 8, this figure depicts a cross-sectional view of the semiconductor device 100 of FIG. 7 after additional fabrication operations, according to embodiments. Backside vias 148 (e.g., nano through-silicon vias (nTSV)) may be etched into the substrate 102. As shown in FIG. 8, a much wider patterning misalignment window 150 exists for the nTSV due to the wider dimension of the bottom of the BPRs.

Figure 9:
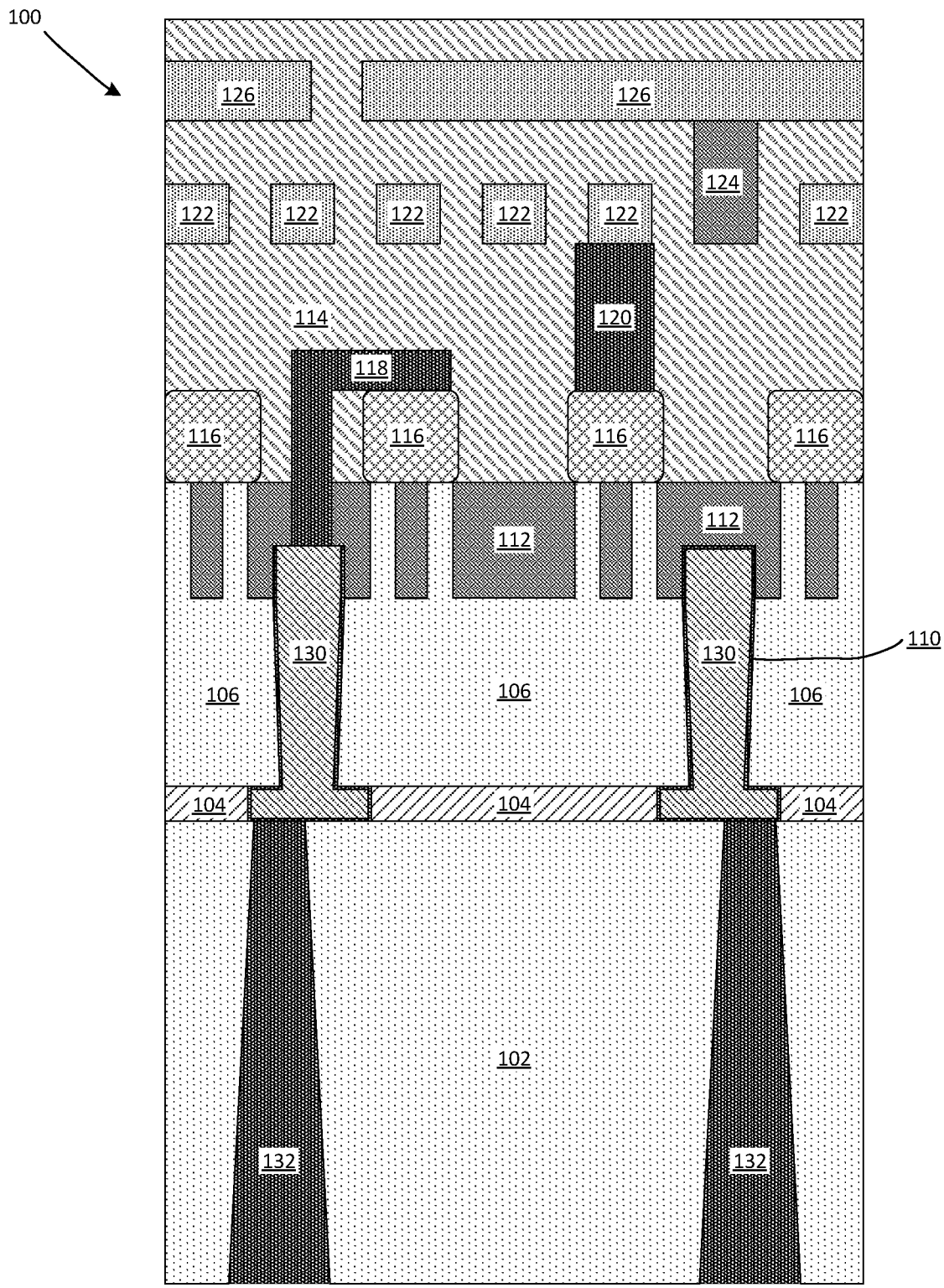
FIG. 9 is a cross-sectional view of the semiconductor device of FIG. 8 after additional fabrication operations, according to embodiments.

Referring now to FIG. 9, this figure depicts a cross-sectional view of the semiconductor device 100 of FIG. 8 after the backside vias 148 have been filled in with nTSV metal contacts 132 (or second metallizations), according to embodiments. As shown in FIG. 9, after the nTSV metal contacts 132 are formed, a backside power wire (not shown) may be formed over the nTSV metal contacts 132 to connect to the BPRs 130. For ease of understanding, the locations of the nTSV metal contacts 132 relative to the wider portions of the BPRs 130 are purposely drawn to be misaligned somewhat from the center of the BPRs 130. As mentioned above, the small dimensions of related device BPR landings could be a cause for misalignment with nTSV when forming nTSV through the relatively thick substrate. However, according to the present embodiments, the wider w2 dimension of the bottoms of the first trenches 109 (see, FIG. 4) may allow for increased flexibility with regard to the wider landing area of the BPR. Thus, in the present embodiments, any misalignments of the backside nTSV metal contacts 132 from the true center of the BPR (e.g., as the one purposefully shown in FIG. 8) may not result in any performance degradation because there is still complete contact between the BPR 130 and the backside nTSV metal contacts 132. Thus, in the embodiments related to FIGS. 1-9, backside power may be delivered to a buried power rail through the nTSV metal contacts 132.

Figure 10:
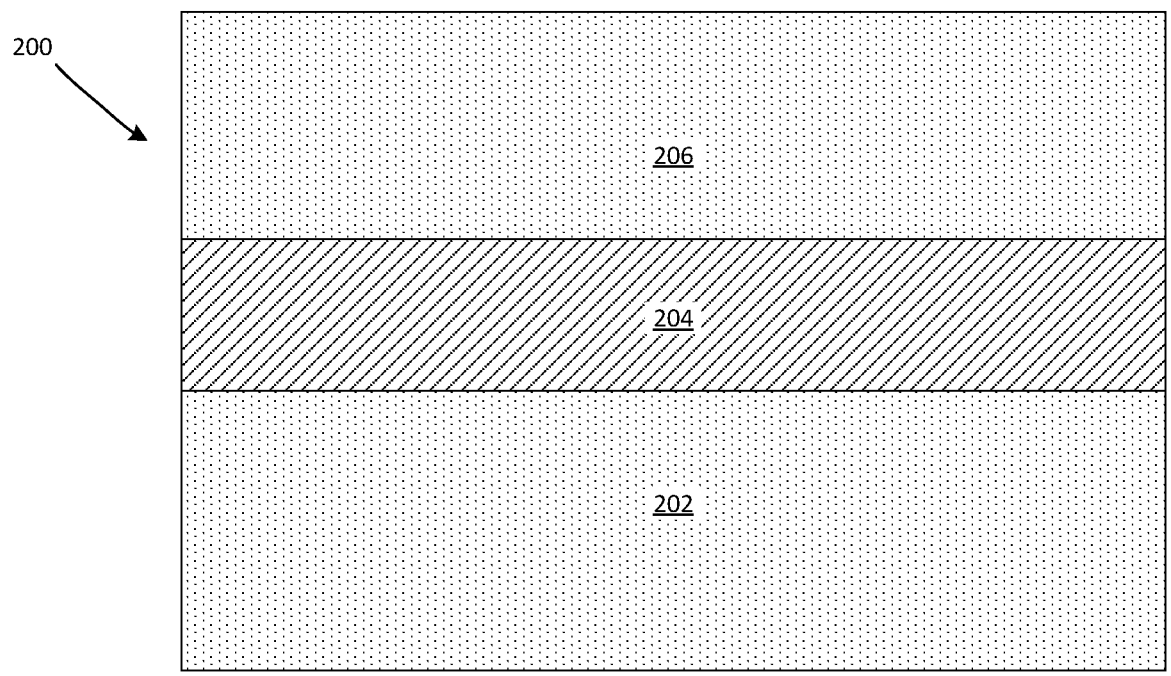
FIG. 10 is a cross-sectional view of a semiconductor device at an intermediate stage of the manufacturing process, according to embodiments.

Referring now to FIG. 10, this figure depicts a cross-sectional view of a semiconductor device 200, according to embodiments. As shown in FIG. 10, a substrate 202 is provided. The substrate 202 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 202 may also be a semiconductor on insulator (SOI) substrate. The substrate 202 may be comprised of any other suitable material(s) that those listed above. As will be described in further detail below, the substrate 202 may ultimately subjected to a thinning process, where the substrate 202 is gradually removed by one or more of a grinding process and a chemical etching process. As shown in FIG. 2, a SiGe layer 204 is formed by epitaxy growth on the upper surface of the substrate 202. A second epitaxy layer 206 (e.g., additional Si material) is formed on the SiGe layer 204. The thickness of the layer 204 may range from about 5 to 40 nm, and the thickness of the second epitaxy layer 206 may range from about 10 to 300 nm.

Figure 11:
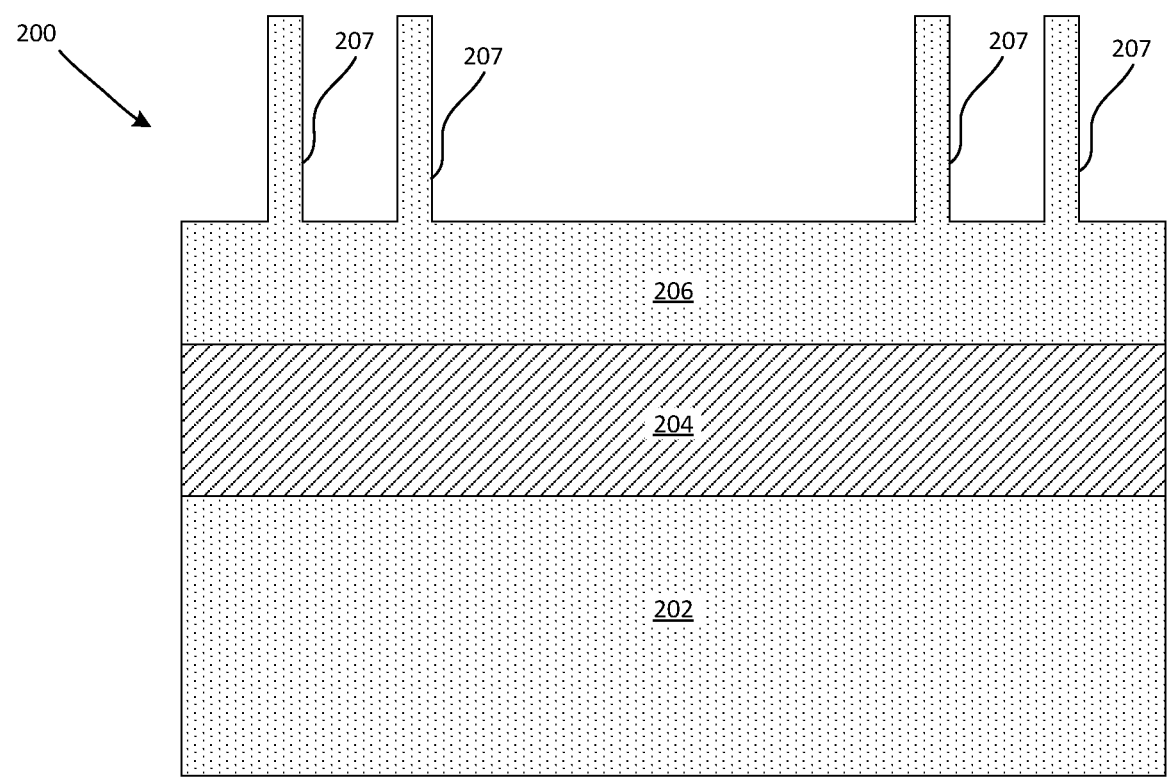
FIG. 11 is a cross-sectional view of the semiconductor device of FIG. 10 after additional fabrication operations.

Referring now to FIG. 11, this figure depicts a cross-sectional view of the semiconductor device 200 of FIG. 10 after additional fabrication operations, according to embodiments. As shown in FIG. 11, transistor fins 207 may be formed by etching into the second epitaxial layer 206. This patterning may be performed with any suitable etching technique such as RIE or plasma etching. It should be noted that the positions and the height of the fins 207 shown in the embodiments related to FIG. 11 are different that those with respect to FIG. 2. However, as indicated above, the thicknesses and other dimensions of the embodiments may not be drawn to scale.

Figure 12:
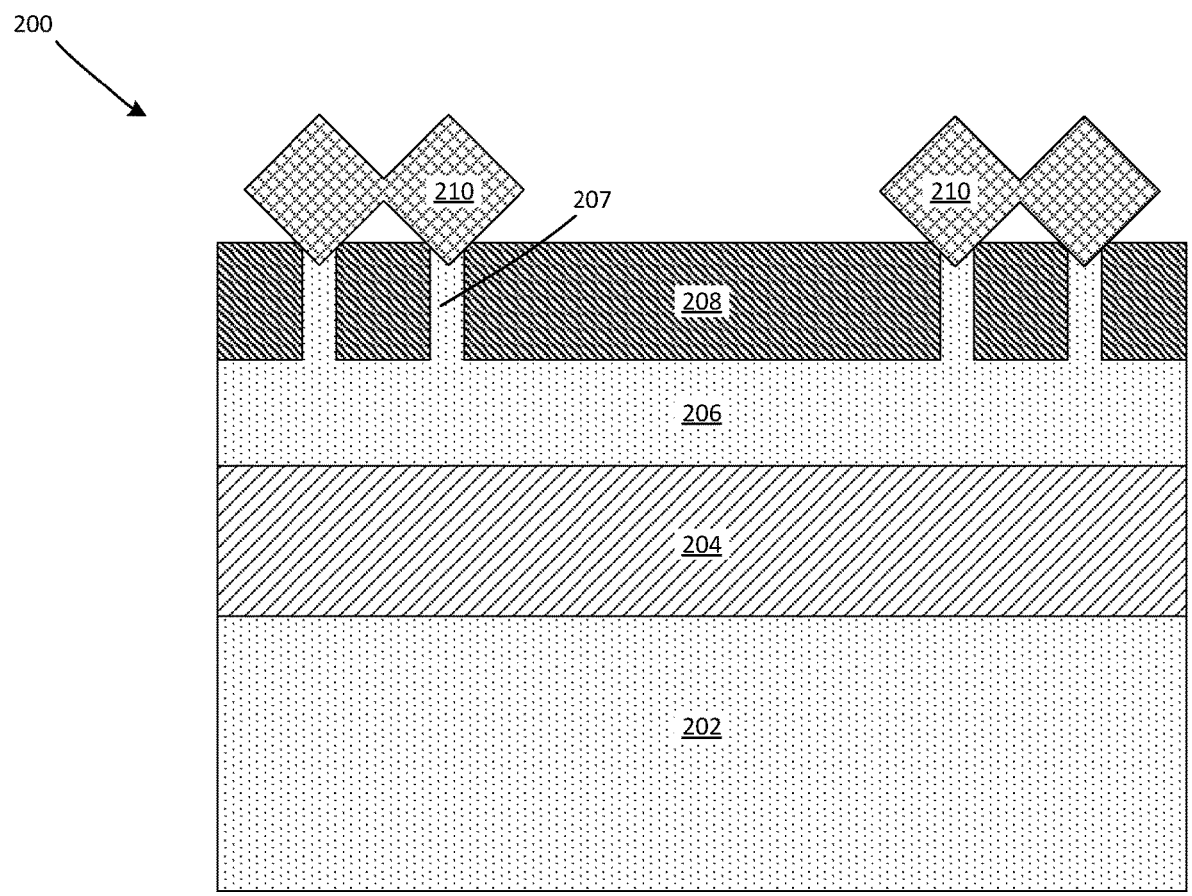
FIG. 12 is a cross-sectional view of the semiconductor device of FIG. 11 after additional fabrication operations, according to embodiments.

Referring now to FIG. 12, this figure depicts a cross-sectional view of the semiconductor device 200 of FIG. 11 after additional fabrication operations, according to embodiments. As shown in FIG. 12, after the formation of the transistor fins 207, a shallow-trench isolation (STI) layer 208 is formed on the second epitaxial layer 206 and between the transistor fins 207. A suitable planarization process (e.g., CMP) may be performed on the semiconductor device 200 to planarize the top surfaces of the transistor fins 207 and the STI layer 208. Then, gate and spacers (not shown), and source/drain epitaxial regions 210 are formed on the top exposed surfaces of the transistor fins 207 by a suitable epitaxial growth process.

Figure 13:
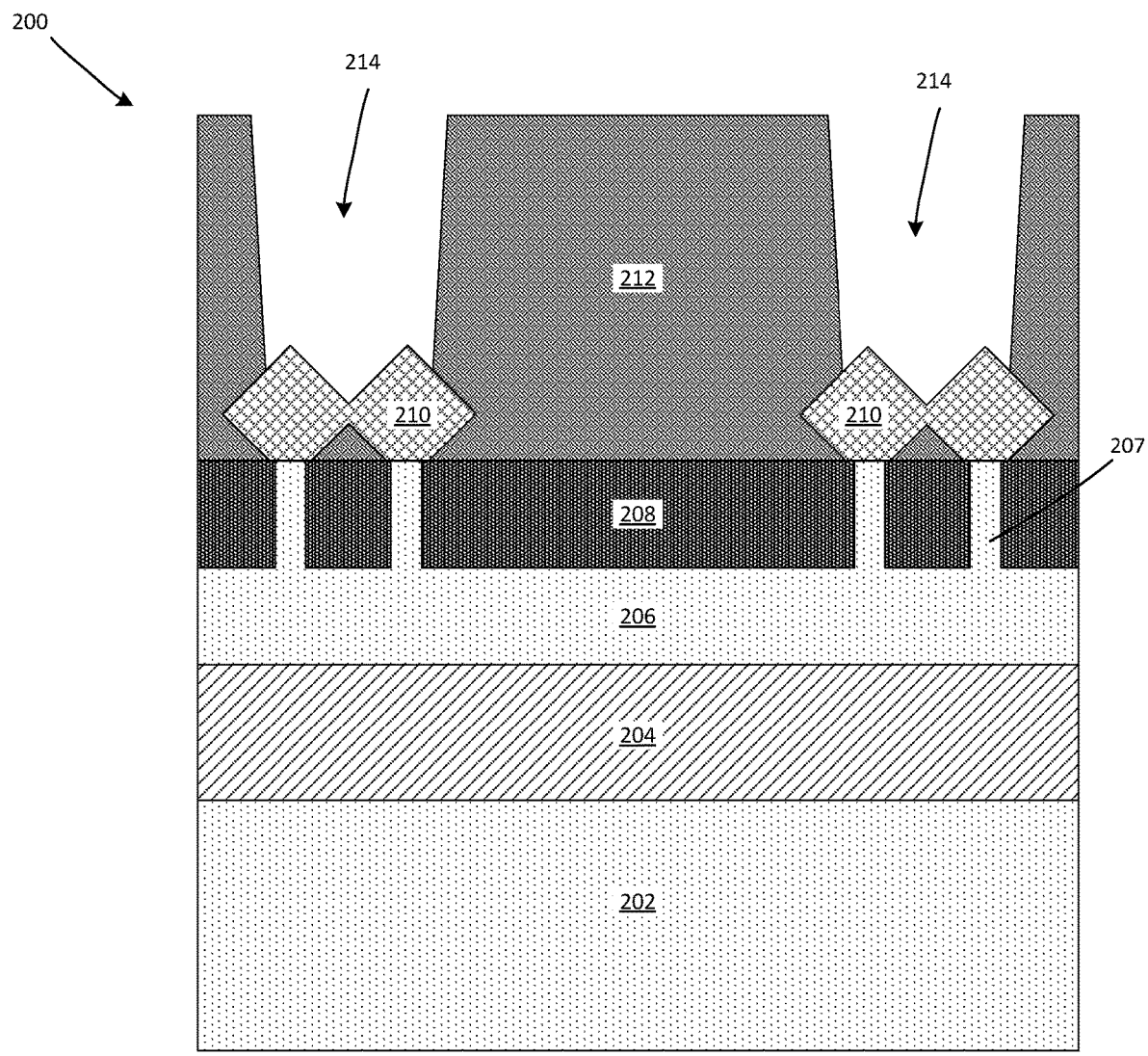
FIG. 13 is a cross-sectional view of the semiconductor device of FIG. 12 after additional fabrication operations, according to embodiments.

Referring now to FIG. 13, this figure depicts a cross-sectional view of the semiconductor device 200 of FIG. 12 after additional fabrication operations, according to embodiments. As shown in FIG. 13, after the formation of the source/drain epitaxial regions 210, an interlayer dielectric layer (ILD) 212 is formed thereon. After that, dummy gate could be removed and replacement gate could be filled inside the transistor gate (not shown). Then contacts 214 are formed into the ILD layer 212 with any suitable material removal process (e.g., RIE). It should be noted that in certain embodiments a contact may be formed as vias, and in other embodiments a contact may be formed as a trench.

Figure 14:
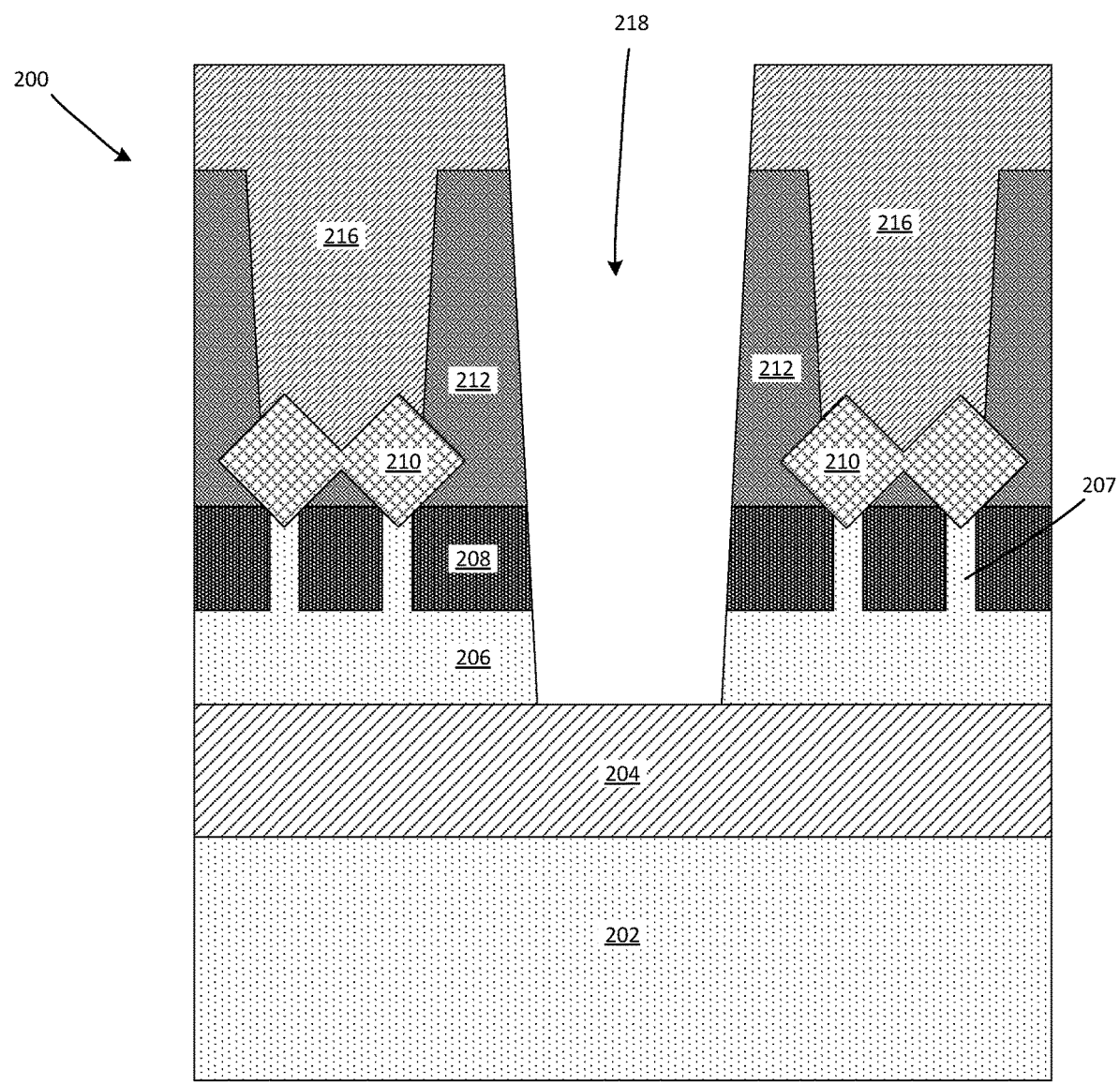
FIG. 14 is a cross-sectional view of the semiconductor device of FIG. 13 after additional fabrication operations, according to embodiments.

Referring now to FIG. 14, this figure depicts a cross-sectional view of the semiconductor device 200 of FIG. 13 after additional fabrication operations, according to embodiments. As shown in FIG. 14, after the formation of the contact 214, and an organic planarization layer 216 is formed to cover the entire semiconductor device 200. After the formation of the organic planarization layer 216, a cross-level via 218 is formed by etching through the organic planarization layer 216, the STI layer 208, and through the second epitaxial layer 206 to expose the underlying SiGe layer 204.

Figure 15:
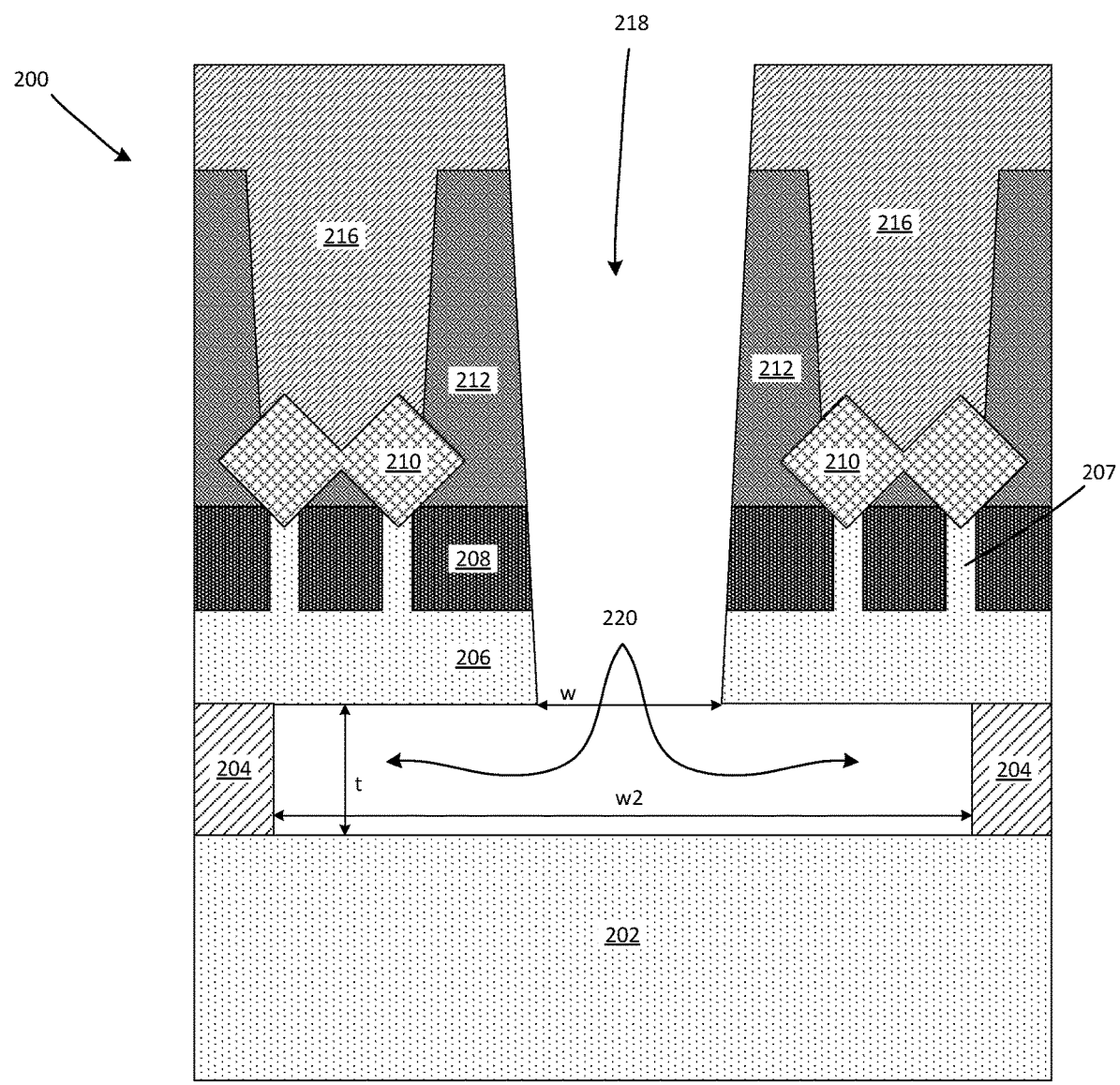
FIG. 15 is a cross-sectional view of the semiconductor device of FIG. 14 after additional fabrication operations, according to embodiments.
Figure 16:
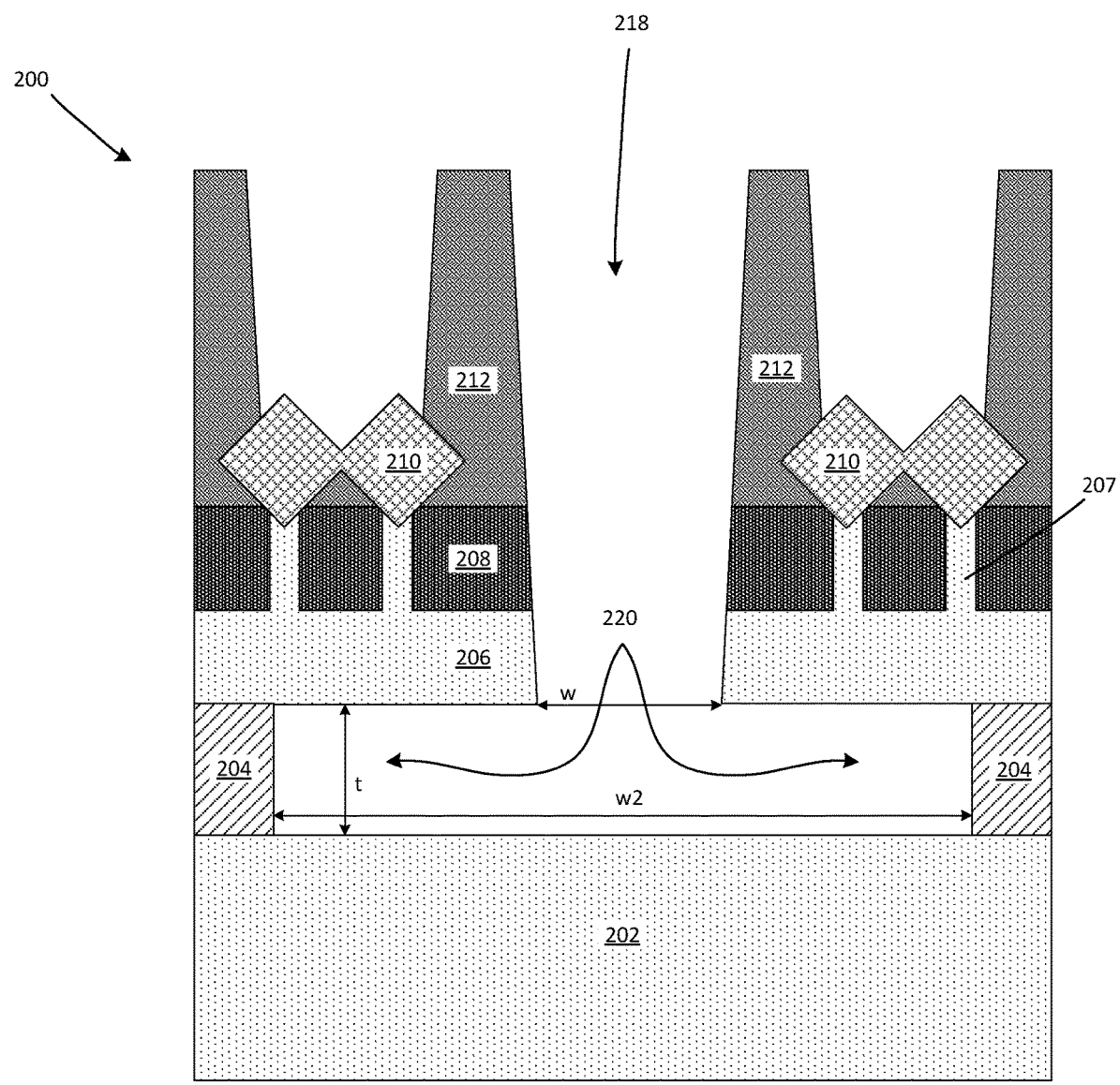
FIG. 16 is a cross-sectional view of the semiconductor device of FIG. 15 after additional fabrication operations, according to embodiments.

Referring now to FIG. 15, this figure depicts a cross-sectional view of the semiconductor device 200 of FIG. 14 after additional fabrication operations, according to embodiments. As shown in FIG. 15, a lateral side etching of the SiGe layer 204 is performed to widen out an area 220 between the substrate 202 and the second epitaxial layer 206. In certain examples, the w dimension is greater than the t dimension to ensure that a good metal fill can be achieved. Thus, this additional lateral etching step alters the shape of the cross-level via 218 so that the bottom portion area 220 of the cross-level via 218 in the vicinity of the SiGe layer 204 has a wider w2 dimension than the w dimension described above. This area of the cross-level via 218 is where the backside nTSV will land, as described in detail below. As described above, due to the small size of the cross-level via, misalignments could occur when we want to further land a nTSV over it. However, according to the present embodiments, the wider w2 dimension of the bottom of the cross-level via 218 allows for increased flexibility with regard to the wider landing area. Thus, in the present embodiments, misalignments and any resulting performance degradation associated therewith may be minimized. As shown in FIG. 16, the remaining material of the organic planarization layer 216 is removed.

Figure 17:
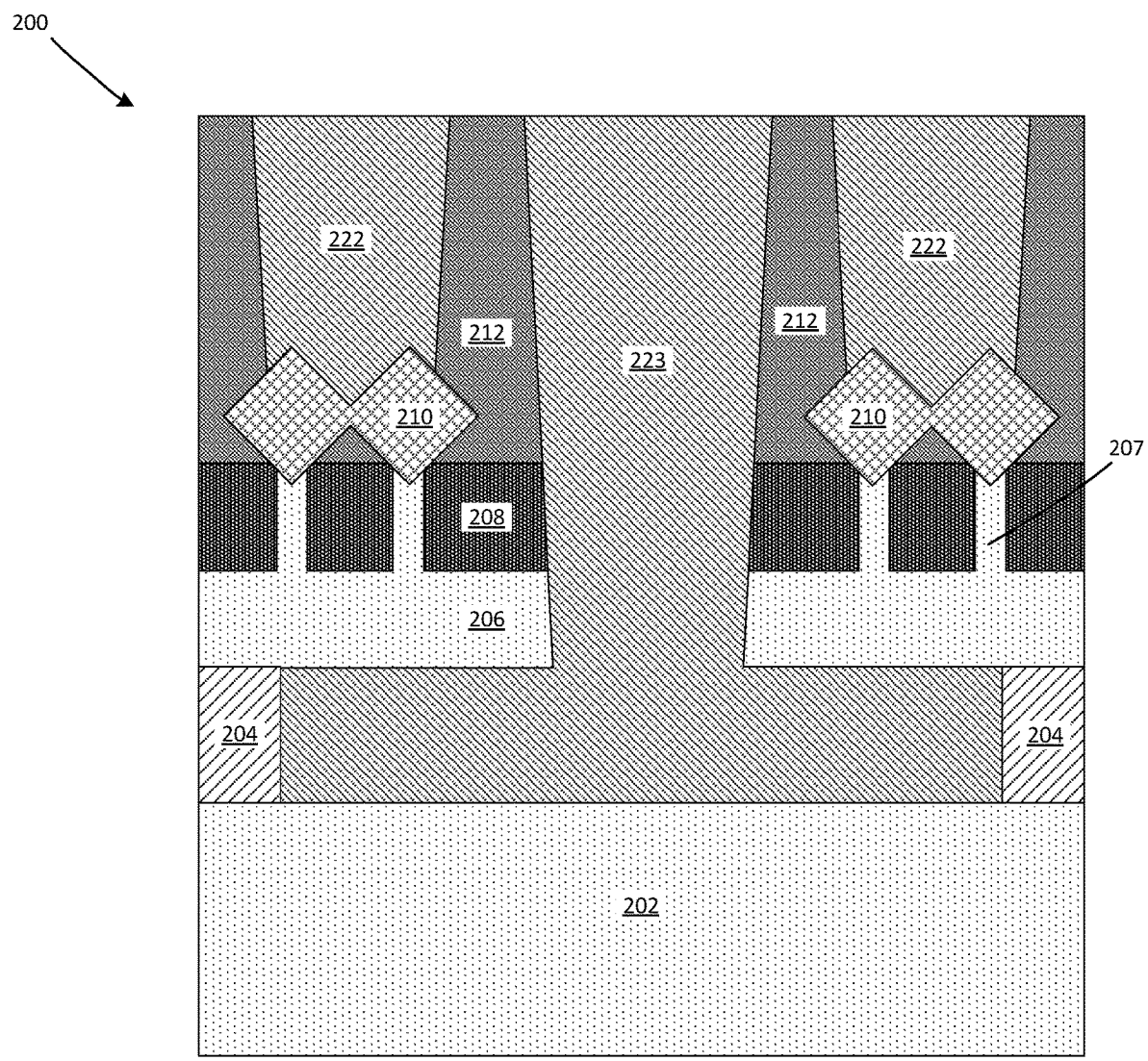
FIG. 17 is a cross-sectional view of the semiconductor device of FIG. 16 after additional fabrication operations, according to embodiments.
Figure 18:
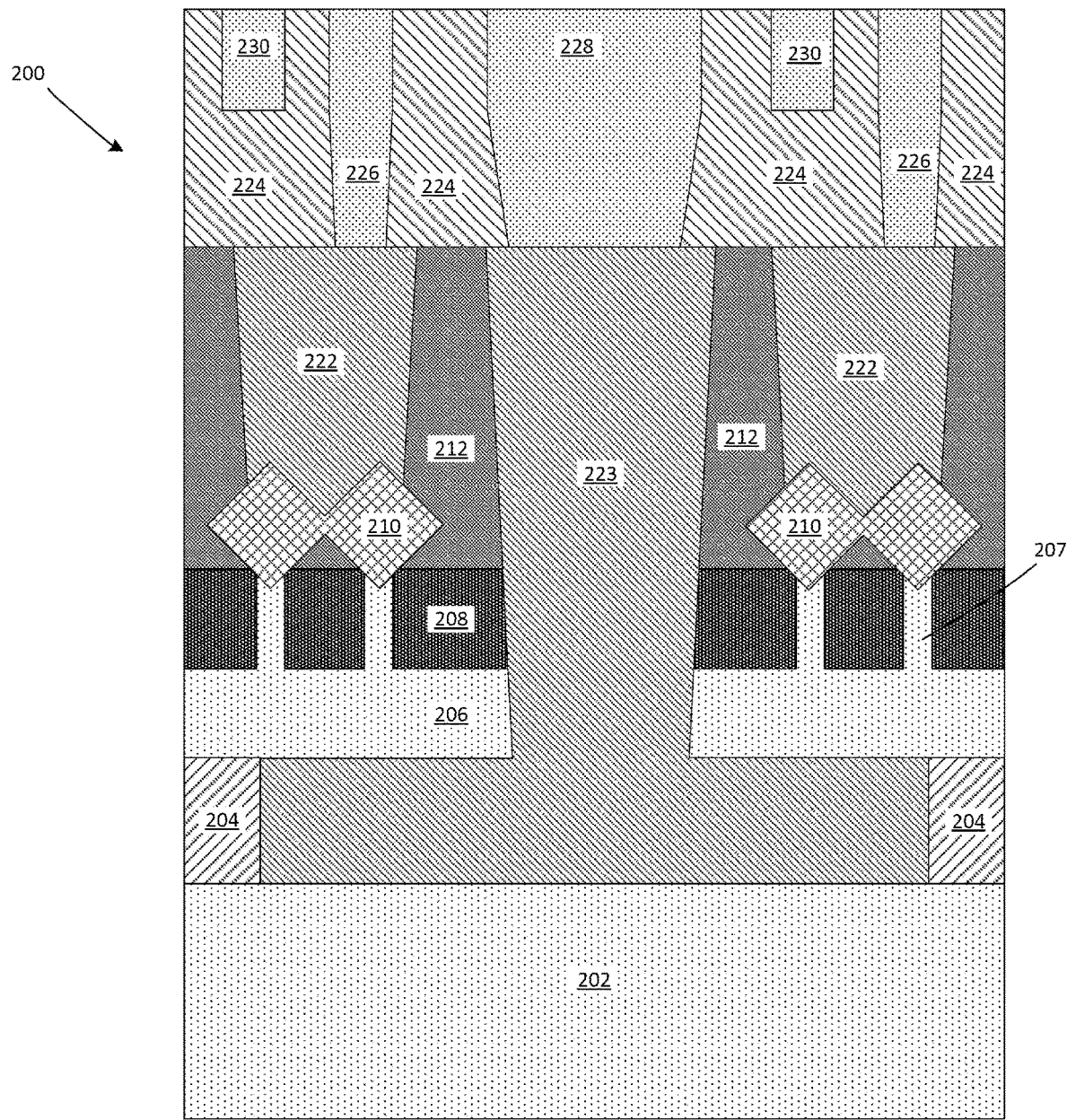
FIG. 18 is a cross-sectional view of the semiconductor device of FIG. 17 after additional fabrication operations, according to embodiments.

Referring now to FIGS. 17 and 18, these figures depict cross-sectional views of the semiconductor device 200 of FIG. 16 after additional fabrication operations, according to embodiments. As shown in FIGS. 17 and 18, several additional components are formed, which may include front-end-of-line (FEOL) components, middle-of-line (MOL) components, and back-end-of-line (BEOL) components. In the example shown in FIG. 17, several contacts 222 and 223 (e.g., a cross-level via) are formed. A planarization process (e.g., CMP) may again be performed on the semiconductor device 200 to planarize the top surface thereof after the formation of the contacts 222 and cross-level via 223.

As shown in FIG. 18, one or more dielectric layer 224, second vias 226, metal lines 230, and contacts 228 may be formed as part of the FEOL, MOL and BEOL layers. It should be appreciated that the configuration of the FEOL, MOL and BEOL layers (not shown) and components thereof are merely one example that is used for the sake of providing context to the locations of the contacts 222 and cross-level via 223 relative to the other components, and any suitable number/position/configuration of the layers may be used. It should be appreciated that a combination of material removal processes (e.g., etching) and material addition processes (e.g., patterning and deposition) that are known one of skill in the art (and as described herein) may be used to generate the structures shown in FIG. 18. It should also be appreciated that the positions and locations of the various components may be varied in any suitable manner according to the specific application.

Figure 19:
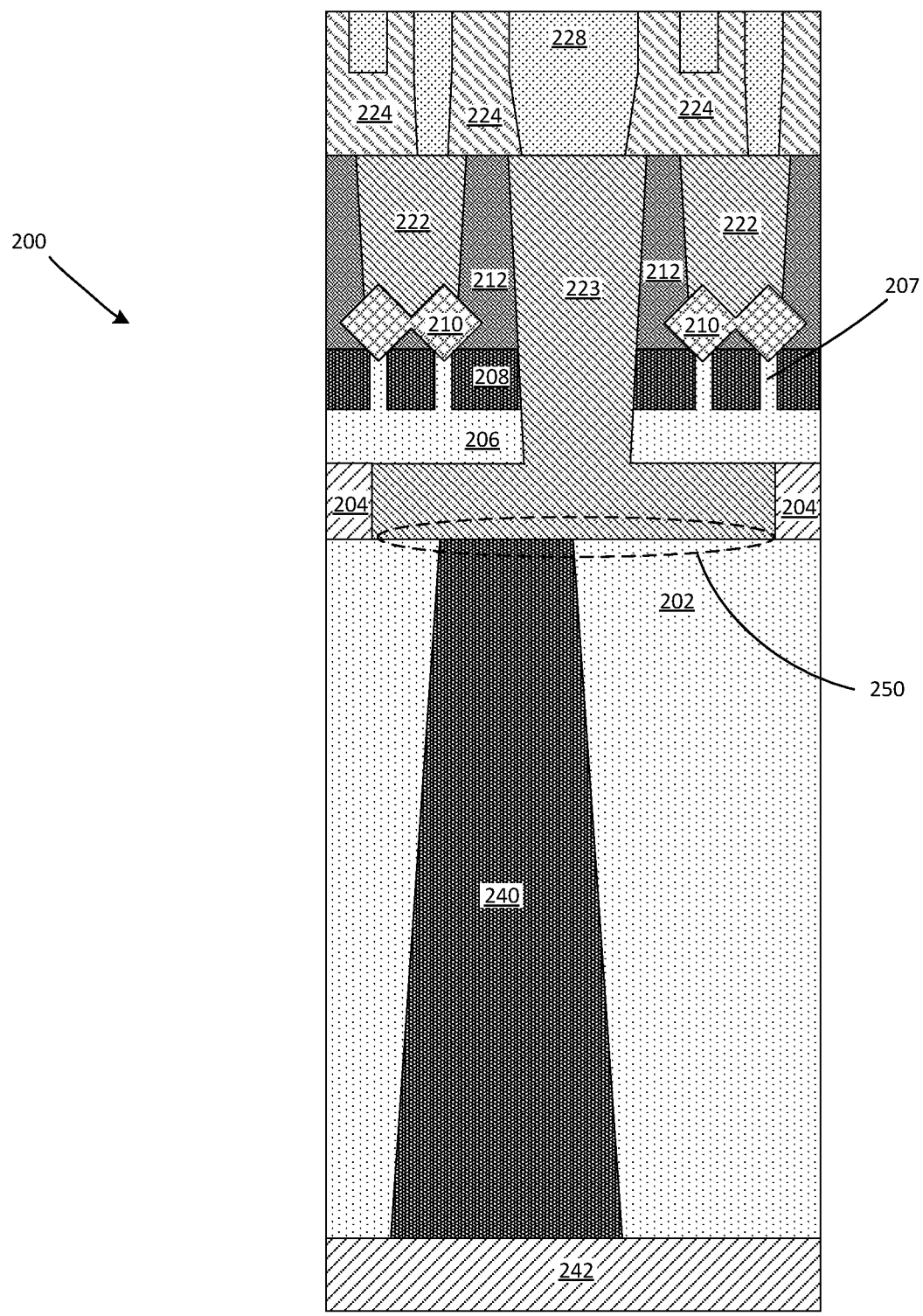
FIG. 19 is a cross-sectional view of the semiconductor device of FIG. 18 after additional fabrication operations, according to embodiments.

Referring now to FIG. 19, this figure depicts a cross-sectional view of the semiconductor device 200 of FIG. 18 after additional fabrication operations, according to embodiments. As shown in FIG. 19, the semiconductor device 200 may be flipped upside down to prepare the device for substrate 202 thinning (although it is not shown to be flipped in FIG. 19). As shown in FIG. 19, substrate 202 thinning is performed to remove a certain amount of the substrate 202. This material removal step is continued until the substrate 202 is thinned down to a thickness of about 100 nm or 500 nm, for example. Other final thicknesses of the substrate may be suitable as well. Note that alternative approaches can be used other than Si thinning to achieve a desired Si thickness of the substrate 202. In certain embodiments, a carrier wafer (not shown) may also be bonded to the BEOL layers (not shown). Backside nTSV 240 may be etched into the substrate 202. As shown in FIG. 19, a much wider patterning misalignment window 250 exists for the nTSV due to the wider dimension of the bottom of the cross-level via 223.

As shown in FIG. 19, after the backside nTSV 240 is formed, a backside power wire 242 may be formed over the nTSV 240. For ease of understanding, the location of the backside nTSV 240 relative to the wider portion of the cross-level via 223 is purposely drawn to be misaligned somewhat from the center of the cross-level via 223. As mentioned above, the small dimensions of related device landings could be a cause shrinking of spaces between devices. However, according to the present embodiments, the wider w2 dimension of the bottom of the cross-level vias 218 (see, FIG. 16) may allow for increased flexibility with regard to the wider landing area of the cross-level via 223. Thus, in the present embodiments, any misalignments of the backside nTSV 240 from the true center of the contact (e.g., as the one purposefully shown in FIG. 19) may not result in any performance degradation because there is still complete contact between the cross-level via 223 and the backside nTSV 240.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
   a first substrate;
   a second substrate;
   a SiGe layer provided between the first substrate and the second substrate;
   a buried power rail (BPR) extending through the first substrate and the SiGe layer, a bottom portion of the BPR having portions extending laterally therefrom in the SiGe layer and having a width greater than a width of a top portion of the BPR; and
   a nano though-silicon via formed in the second substrate in contact with the BPR,
   wherein a width of the bottom portion of the BPR is greater than a width of the nano through-silicon via in contact therewith, and
   wherein a thickness of the bottom portion of the BPR is less than a width of the top portion of the BPR.

2. The semiconductor device according to claim 1, further comprising a dielectric liner layer formed on the walls of the BPR.

3. The semiconductor device according to claim 1, further comprising shallow trench isolation (STI) regions formed between portions of the BPR.

4. The semiconductor device according to claim 1, wherein the first substrate includes fins extending therefrom.

5. The semiconductor device according to claim 4, further comprising an interlayer dielectric (ILD) layer formed on the fins of the first substrate.

6. The semiconductor device according to claim 4, further comprising source/drain epitaxial regions formed on the fins of the first substrate.

7. The semiconductor device according to claim 1, further comprising a contact provided on the top portion of the BPR.

* * * * *